US008098110B2

United States Patent
Yang et al.

(10) Patent No.: US 8,098,110 B2
(45) Date of Patent: Jan. 17, 2012

(54) PHASE LOCKED LOOP APPARATUS WITH SELECTABLE CAPACITANCE DEVICE

(75) Inventors: Bo Yang, Austin, TX (US); Harish S. Muthali, Austin, TX (US); Kenneth C. Barnett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 48 days.

(21) Appl. No.: 12/623,097

(22) Filed: Nov. 20, 2009

(65) Prior Publication Data

US 2011/0121910 A1 May 26, 2011

(51) Int. Cl.
H03B 5/12 (2006.01)
H03L 1/00 (2006.01)
H03L 1/02 (2006.01)

(52) U.S. Cl. .......... 331/177 V; 331/36 C; 331/175; 331/176; 331/179

(58) Field of Classification Search .......... 331/25, 331/36 C, 117 R, 117 FE, 117 D, 175, 176, 331/177 R, 177 V, 179
See application file for complete search history.

(56) References Cited

U.S. PATENT DOCUMENTS

| | | | | |
|---|---|---|---|---|
| 6,133,797 A | * | 10/2000 | Lovelace et al. | 331/17 |
| 6,268,778 B1 | * | 7/2001 | Mucke et al. | 331/117 R |
| 6,621,362 B2 | * | 9/2003 | Momtaz et al. | 331/117 R |
| 6,906,596 B2 | * | 6/2005 | Kitamura et al. | 331/36 C |
| 7,133,485 B1 | | 11/2006 | Baird et al. | |
| 7,336,134 B1 | * | 2/2008 | Janesch et al. | 331/36 C |
| 7,408,422 B2 | * | 8/2008 | Dedieu et al. | 331/177 V |
| 7,646,257 B2 | * | 1/2010 | Gailus et al. | 331/177 V |
| 7,675,373 B2 | * | 3/2010 | Thaller | 331/57 |
| 2005/0090218 A1 | * | 4/2005 | Ishida et al. | 455/255 |
| 2006/0197623 A1 | | 9/2006 | Loke et al. | |
| 2007/0040625 A1 | | 2/2007 | Yu et al. | |

OTHER PUBLICATIONS

Nonis et al., "Modeling, Design and Characterization of a New Low-Jitter Analog Dual Tuning LC-VCO PLL Architecture", IEEE Journal of Solid-State Circuits, vol. 40, No. 6, pp. 1303-1309, Jun. 2005.
International Search Report and Written Opinion—PCT/US2010/057683, International Search Authority—European Patent Office—Feb. 23, 2011.

* cited by examiner

*Primary Examiner* — David Mis
(74) *Attorney, Agent, or Firm* — Jiayu Xu (57) ABSTRACT

A phase locked loop apparatus includes an oscillator, a variable capacitance device, a selectable capacitance device, and a capacitance controller that is configured to provide a control signal to the selectable capacitance device. The selectable capacitance device is connected to the oscillator and is responsive to the control signal such that the selectable capacitance device has a first capacitance at a first control signal value and a second capacitance at a second control signal value. The capacitance controller only selects either the first capacitance or the second capacitance by providing a control signal that has the first control signal value to select the first capacitance and having the second control signal value to select the second capacitance.

32 Claims, 7 Drawing Sheets

PHASE LOCKED LOOP APPARATUS WITH SELECTABLE CAPACITANCE DEVICE

TECHNICAL FIELD

The present invention relates generally to phase-locked loops, and more specifically to phase locked loops with selectable capacitance devices.

BACKGROUND

Phase-locked loops (PLLs) generate signals relative to a reference signal. The phase-locked loop circuit adjusts a frequency of a PLL output signal based on differences in phase and/or frequency of the reference signal and the output signal. The frequency of the output signal is increased or decreased based on the difference. The phase-locked loop is, therefore, a control system using negative feedback. Phase-locked loops are used in electronics such as radios, telecommunication circuits, and computers as well as other devices.

PLLs often use a resonant-tuned voltage controlled oscillator (VCO) to generate the PLL output signal. A resonant tuned VCO often includes a capacitive device and a resonant inductor-capacitor (LC) circuit. The capacitive device typically includes at least one varactor having a capacitance that responds to a tuning voltage to change the frequency of the PLL output signal.

The VCO gain is the VCO frequency shift per unit change in the varactor tuning voltage. PLL circuits are designed to select a VCO gain that results in an appropriately large bandwidth with minimum phase noise. Conventional PLLs are limited in that often the relatively large VCO gain needed to achieve frequency locking results in unacceptable phase noise.

Accordingly, there is need for a PLL with sufficiently large bandwidth with minimum phase noise.

SUMMARY

A phase locked loop apparatus includes an oscillator, a variable capacitive device, a selective capacitive device, and a capacitance controller that is configured to provide a control signal to the selective capacitance device. The selective capacitance device is connected to the oscillator and is responsive to the control signal such that the selective capacitance device has a first capacitance at a first control signal value and a second capacitance at a second control signal value. The capacitance controller only selects either the first capacitance or the second capacitance by providing a control signal that has the first control signal value to select the first capacitance and having the second control signal value to select the second capacitance.

DETAILED DESCRIPTION

A PLL apparatus includes a selectable capacitance device and a variable capacitance device connected to an oscillator. A tuning signal applied at the variable capacitance device changes a capacitance seen by the oscillator to change a frequency of the oscillator output signal. A capacitance controller provides a control signal to the selectable capacitance device where the control signal varies between a first control signal value and a second control signal value to select either the a first capacitance or a second capacitance of the selectable capacitance device. Where the selectable capacitance device is implemented with one or more non-linear variable capacitance elements, such as varactors, the control signal values are selected to bias the non-linear variable capacitance elements within regions of the capacitance to voltage function having minimal sensitivity to voltage changes.

The selected capacitance of the selectable capacitance device at least partially determines the frequency of the oscillator signal and establishes a relationship between tuning signal voltage and the oscillator signal frequency. The tuning voltage range can be shifted to compensate changes affecting the input voltage to frequency relationship.

In order to minimize noise due to abrupt changes in capacitance, voltage change limiters limit the rate of change in voltage at the control port of the selectable capacitance device. The voltage change limiters may include filters and/or current limiters that manage the change in voltage applied to the control port of the selectable capacitance device during a transition from the first control signal value to the second control signal value.

One suitable implementation of the PLL device discussed below includes implementing the selectable capacitance device within a selectable capacitance arrangement that includes a plurality of selectable capacitance devices, each controlled by a separate control signal.

The word "exemplary" is used herein to mean "serving as an example, instance, or illustration." Any embodiment described herein as "exemplary" is not necessarily to be construed as preferred or advantageous over other embodiments. The functions of the components, devices, elements and other functional blocks described below may be implemented by any arrangement of combination of elements. Functions described as performed by a single functional block may be performed by multiple elements or devices and functions described as performed by multiple blocks may be performed by a single device in some circumstances.

Figure 1A:
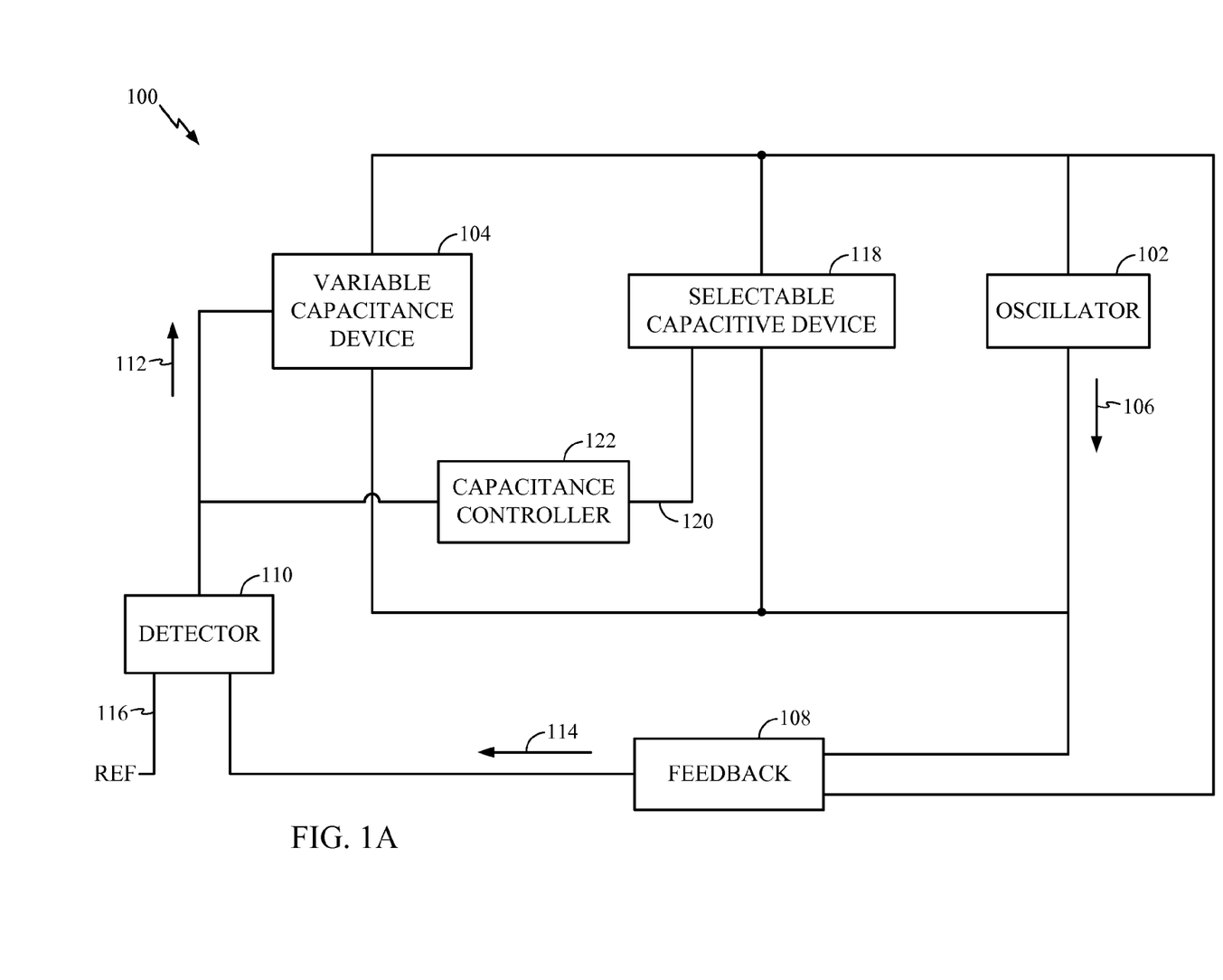
FIG. 1A is a block diagram of a phase locked loop (PLL) apparatus in accordance with an exemplary embodiment of the invention.

FIG. 1A is a block diagram of a phase locked loop (PLL) apparatus 100 in accordance with an exemplary embodiment. The PLL apparatus 100 may include other elements not shown in FIG. 1 and some other elements are discussed below with reference to other figures. The PLL apparatus 100 includes an oscillator 102 connected to a variable capacitance device 104 to form a voltage controlled oscillator (VCO). The oscillator output signal 106 of the oscillator 102 is presented through a feedback 108 to a detector 110. The detector 110 generates a tuning signal 112 in accordance with a difference between the feedback signal 114 and a reference signal 116. The tuning signal 112 changes a capacitance of the variable capacitance device 104 to adjust the frequency of the output of the oscillator 102. A selectable capacitance device 118 is also connected to the oscillator 102. A control signal 120 generated by a capacitance controller 122 varies between a first control signal value and a second control signal value to select a capacitance of the selective capacitive device 118. The capacitance controller 122 sets the capacitance of the selectable capacitance device 118 to establish a frequency range of the frequency of the oscillator output signal 106.

During operation of the PLL apparatus 100, the detector 110 compares a phase and/or frequency of the feedback signal 114 to the phase and/or frequency of the reference signal 116 and generates a correction signal. As discussed below, an example of a suitable implementation of the PLL 100 includes a charge pump and low pass filter for further processing the correction signal to provide the tuning signal 112 to the variable capacitance device 104. The variable capacitance device 104 is any element, device, component, or arrangement thereof that provides a capacitance in accordance with an input signal. For the examples discussed herein, the variable capacitance device 104 includes a set of varactors where each varactor has a capacitance responsive to voltage. The tuning signal 112 provides a voltage to the varactors to change the capacitance across the oscillator 102 which results in a change of the oscillator output signal frequency.

The control signal 120 generated by the capacitance controller 122 controls the capacitance of the selectable capacitance device 118 and, therefore, establishes a capacitance in parallel with the oscillator 102 that at least partially determines the frequency of the oscillator output signal 106. Accordingly, a change in capacitance of the selectable capacitance device 118 results in a shift of the frequency range of the oscillator 102. Since the tuning signal 112 can be limited in range, a change in capacitance also shifts the tuning signal input range. Such an input signal range control may be beneficial in situations where the oscillator frequency range has shifted due to changing circuit parameters and/or external changes. The frequency range may be shifted to at least partially compensate for the undesired shift in frequency range. Examples of events that may cause an undesired frequency range shift include temperature and supply voltage changes, component aging, and changes in physical configuration of circuits, housings, and/or devices that may be caused by mechanical pressure, for example.

The selectable capacitance device 118 is any element, circuit, or device that has a capacitance dependent on a control signal applied to a control port of the device 118. The selectable capacitance device 118 is capable of being set to at least two capacitance values corresponding to two control signal values. The selectable capacitance device 118, however, may be a device that may be set to any number of capacitance values based on the control signal in some circumstances. As discussed below, for example, the selectable capacitance device 118 includes at least one variable capacitive element, such as a varactor, in the exemplary embodiment. Although a device such as varactor may be set to numerous capacitance values, providing a control signal that only can have one of two values allows selection of only two capacitances. In the exemplary embodiment, the selectable capacitance device 118 has a selective capacitance device (SCD) capacitance that is non-linearly related to bias voltage. The capacitance change to voltage change ratio ($\Delta C/\Delta V$) is related non-linearly to bias voltage. Accordingly, the ($\Delta C/\Delta V$) ratio to bias voltage relationship is defined by a function where some bias voltage regions have greater changes in capacitance for a given change in voltage than other bias voltage regions. For the embodiments discussed herein, the first control signal and second control signal values are within bias voltage regions having a lower ($\Delta C/\Delta V$) to bias voltage ratios than other regions. Accordingly, the sensitivity to voltage change is relatively lower at the control signal voltages than at least some other bias voltages. As discussed below in further detail, this results in less sensitivity to noise in the PLL as compared to systems where a control signal voltage is within a region of the function where there is higher sensitivity to voltage and the capacitance change to voltage change ratio is higher.

Figure 1B:
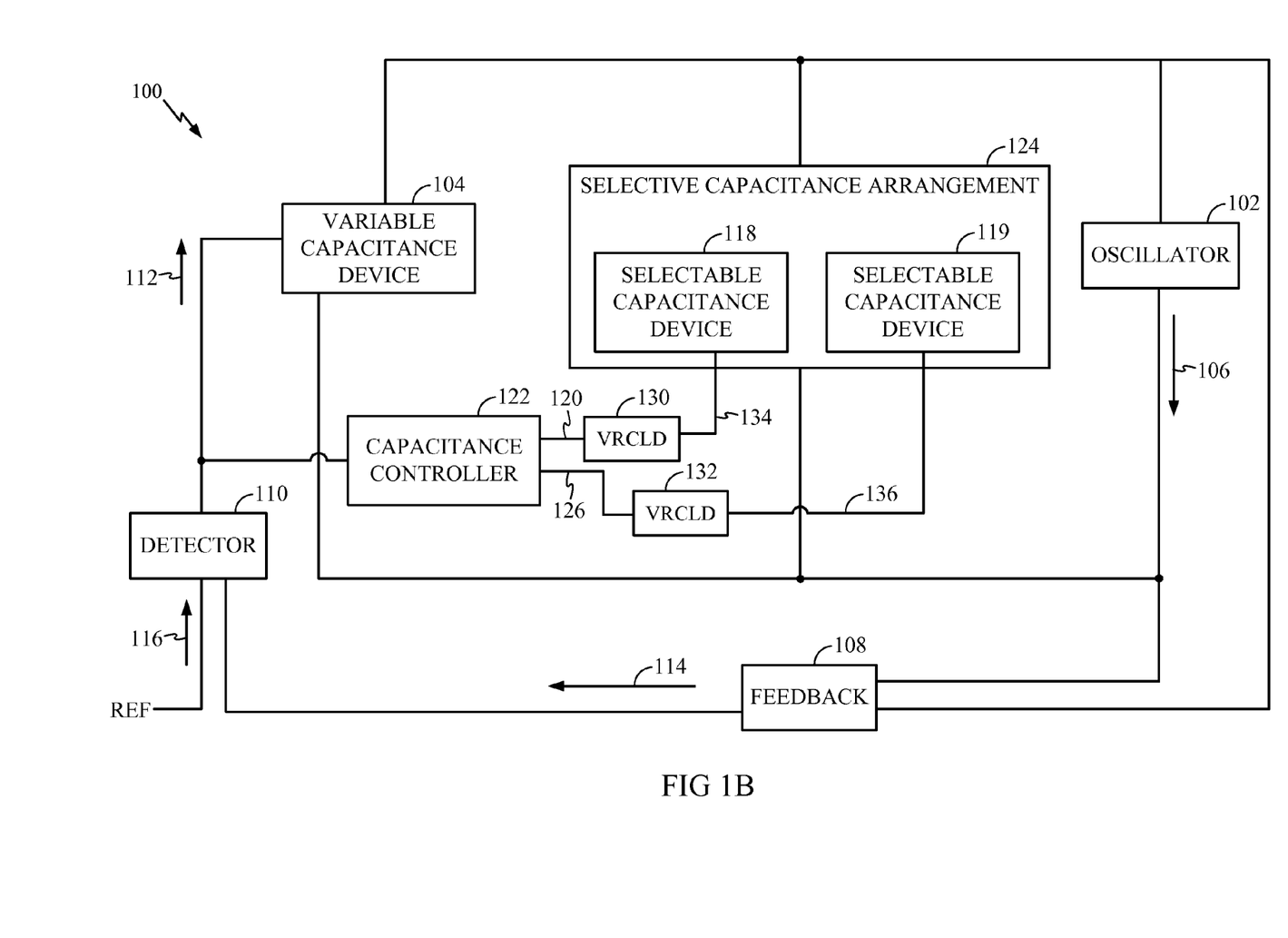
FIG. 1B is a block diagram of the phase locked loop (PLL) apparatus including a plurality of selectable capacitance devices.

FIG. 1B is a block diagram of the PLL device where the selectable capacitance device 118 is one of a plurality of selectable capacitance devices 118-119 within a selective capacitance arrangement 124. Although the selective capacitance arrangement 124 may include any number of selectable capacitance devices 118, FIG. 1B shows only two devices in the interest of clarity and brevity.

Control signals 120, 126 generated by the capacitance controller 122 control the capacitance of each selectable capacitance device 118, 119 and, therefore, establish the capacitance of the selective capacitance arrangement 124. This capacitance in parallel with the oscillator 102 at least partially determines the frequency of the oscillator output signal 106. Accordingly, a change in capacitance of the selective capacitance arrangement 124 results in a shift of the frequency range of the oscillator 102.

The selective capacitance arrangement 124 includes the plurality of selectable capacitance devices 118, 119 that are controlled by a plurality of control signals 120, 126. For the example of FIG. 1B, only two selectable capacitance devices and two control signals are shown although implementations may include several selectable capacitance devices. In some situations, a control signal may control only a single capacitive element. As discussed below, however, an example of a suitable implementation includes a pair of variable capacitive elements in each selectable capacitance device 118-119 where each control signal controls the two variable capacitive elements in a selectable capacitance device. An example of a suitable variable capacitive element is a varactor. Therefore, a selectable capacitance device includes two variable capacitive elements that are varactors in the exemplary implementation discussed below with reference to FIG. 2.

The capacitance controller 122 includes any combination of circuitry, code and/or logical elements that generate control signals to control the selective capacitance arrangement 124 based on a criteria and circumstances. A change in the capacitance of one or more of the selectable capacitance devices 118, 119, results in a shift in oscillator signal frequency for the same tuning voltage. For the examples discussed below, the capacitance controller 122 compares a voltage of the tuning signal to a maximum voltage threshold and a minimum voltage threshold and generates the control signals to shift the tuning signal input when one of the thresholds is reached. The tuning signal input is shifted in an opposite direction to the undesired shift such that a tuning signal with a voltage is further away from extreme value to generate the same oscillator signal frequency. In some circumstances, the capacitance controller 122 may be configured to evaluate a threshold difference between a minimum voltage, maximum voltage and/or nominal voltage. For example, the capacitance controller 122 may shift the tuning input range when the tuning voltage is less than a minimum difference threshold voltage above the minimum voltage or below a maximum voltage. Applying example value, if the minimum voltage is 0.3V and the tuning voltage is 0.3V, the capacitance controller 122 may generate a control signal to shift the frequency of the oscillator signal in a direction such that the tuning voltage is 1.0V to achieve the same oscillator signal frequency as before the shift due to the capacitance change. Accordingly, the capacitance controller can maintain the capacitance to center the tuning signal between the minimum and maximum voltages.

The capacitances of a selectable capacitance devices 118, 119 are maintained between two capacitances, although the selectable capacitance devices 118, 119 may have different values during a transition between values. Accordingly, in these examples, a particular selectable capacitance device has a first component capacitance when a received control signal has a first control signal value and has a second component capacitance when the received control signal has a second control signal value.

In the example, the control signals are managed to limit the rate of change in capacitance of each selectable capacitance device 118, 119. A voltage rate of change limiting device (VRCLD) 130, 132 limits the rate of change in the voltage that is applied to the input at each selectable capacitance device 118, 119. In the exemplary embodiment, therefore, the control signals 120, 126 appear as control voltages 134, 136 at the control inputs of the selectable capacitance devices 118, 119, where the control voltages 134, 136 have rates of increase and decrease that limit the rate of change in capacitance of the selective capacitance arrangement 124.

Therefore, the phase locked loop apparatus 100 discussed with reference to FIG. 1B includes an oscillator 102 configured to generate an oscillator output signal 106, a variable capacitance device 104 connected to the oscillator 102 and having a capacitance responsive to a tuning signal 112 to alter the oscillator output signal 106, and a selective capacitance arrangement 124 connected to the oscillator 102 and comprising a plurality of selectable capacitance devices 118-119. Each of the selectable capacitance devices 118, 119 has a capacitance responsive to a control signal. The capacitance controller 122 is configured to simultaneously provide a first control signal 120 and a second control signal 126 where the first control signal 120 sets a first capacitance of at least one selectable capacitance device 118, and the second control signal 126 sets a second capacitance of at least one other selectable capacitance device 119. The selective capacitance arrangement 124, therefore, has a selective capacitance at least partially dictating a tuning signal input range corresponding to an oscillator signal frequency range where the capacitance controller 122 can be configured to at least partially compensate for a shift in the tuning signal input range. The capacitance controller 122 can compensate for a shift by changing, the first control signal 120, the second control signal 126, or both, to move the tuning signal input range in an opposite direction to the shift direction of the undesired shift.

Figure 2:
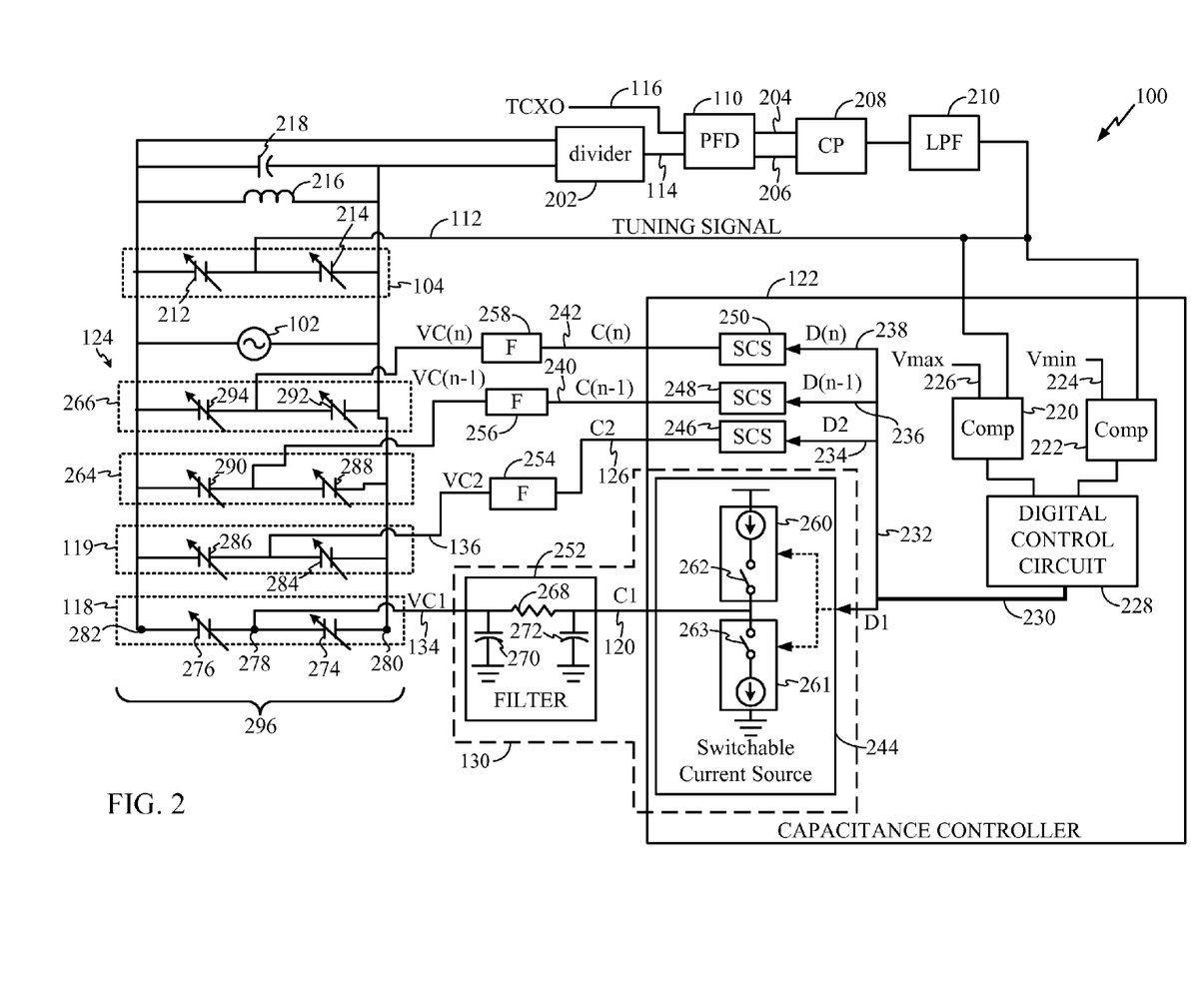
FIG. 2 is a block diagram of an exemplary implementation of the PLL apparatus where the selective capacitance arrangement is a varactor array.

FIG. 2 is a block diagram of an exemplary implementation of the PLL apparatus 100 where the selective capacitance arrangement 124 is a varactor array. For this implementation, the detector 110 is a phase-frequency detector. The reference signal 116 from a crystal oscillator is compared to the feedback signal 114 which is the output of a divider 202. The phase-frequency detector 110 generates an output based on the difference in phase between the two signals. The phase frequency detector 110 is configured to detect a phase error in a frequency synthesizer loop and to provide an up current control signal 204 and a down current control signal 206 based upon the detected phase error. The charge pump 208 is configured to provide a charge pump current signal ($I_{cp}$) based on the up current control signal 204 and the down current control signal 206. The charge pump current signal ($I_{cp}$) is proportional to the phase error detected by the phase frequency detector (110). The output of the charge pump 208 is fed into the low pass filter 210 to provide the tuning signal 112 which is applied to the variable capacitance device 104 and to the capacitance controller 122.

For this example, the variable capacitance device 104 includes two varactors 212, 214 such that the tuning signal 112 varies the capacitance in parallel with the oscillator 102. An inductor 216 and a fixed capacitance capacitor 218 provide a fixed portion of a resonant circuit for the PLL 100. In this exemplary embodiment, the capacitance controller 122 includes two comparators 220, 222 that compare the tuning signal 112 to a minimum voltage 224 and a maximum voltage 226. The minimum and maximum voltages establish a desired range for the tuning signal 112. For example, the minimum voltage may be a selected voltage above the minimum ground within a device containing the PLL. The maximum voltage may be a voltage slightly below the maximum battery voltage of the battery. The minimum and maximum voltages may be fixed or may be dynamic. In addition, hysteresis could be added for maximum voltage and minimum voltage in some circumstances.

The digital control circuit 228 in the capacitance controller 122 processes the outputs from the comparators 220, 222 and determines the appropriate capacitance for the selective capacitance arrangement 124. The digital control circuit 228 generates a control signal bus 230 that includes a plurality of digital signals 232, 234, 236, 238 that result in at least the two control signals 120, 126. For this embodiment, the number of digital control signals and control signals depends on the number of selectable capacitance devices since each control signal is applied to a selectable capacitance device. The control signal bus 230 may include any number of control signals depending on the particular arrangement. Accordingly, FIG. 2 shows four control signals where two control signals 240, 242 are labeled C(N−1) and C(N) to indicate that any number of control signals may be used depending on the particular implementation. For this example, therefore, the plurality of control signals includes the first control signal 120, the second control signal 126, and the control signals 240, 242. Each control signal results from a digital signal generated by the digital control circuit 228 and indicates one of two values. For example, the digital control signals may switch between a logic high value ("1") and a logic low value ("0"). Each control signal 120, 126, 240, 242 sets one selectable capacitance device to one of two capacitance values. The digital control circuit 228 may include any combination of hardware, software and/or firmware components. Accordingly, the digital control circuit 228 may include a processor, logic components and analog circuit elements. In the exemplary embodiment, the digital control circuit 228 is implemented with logic components.

As explained above, each selectable capacitance device is switched between a first component capacitance and a second component capacitance where the first component capacitance and the second component capacitance of one selectable capacitance device may be the same as or different from the first component capacitance and the second component capacitance of another selectable capacitance device. The digital control circuit 228 generates the control signals such that the capacitances of the selectable capacitance devices combine to establish the appropriate capacitance of the selective capacitance arrangement 124.

Each digital signal 232, 234, 236, 238 generated by the digital control circuit 228 controls a switchable current source 244, 246, 248, 250 connected to a filter 252, 254, 256, 258. For this example, each switchable current source includes a charging current source 260 and discharging current source 261 where the two current sources 260, 261 are represented by a direct current source and a switch. An example of suitable implementation of a switchable current source includes charge pump. In this embodiment, the digital signal opens one of the switches and closes the other switch. Where the digital signal is a logic high, the charging switch 262 is closed and the discharging switch 263 is opened allowing the charging current source 260 to provide current to the charge limiting device. Where the digital signal is a logic low, the charging switch 262 is opened and the discharging switch 263 is closed allowing the discharging current source 261 to drain current from the filter 252 to ground. The polarity of the digital signals may be reversed in some implementations.

For the example discussed with reference to FIG. 2, the VRCLDs 130, 132 are implemented with a filter 252, 254 and a SCS 244, 246. Although not shown in FIG. 2, each control signal is processed by a VRCLD which at least partially determines a rate of change in voltage at the corresponding selectable capacitance device 118, 119, 264, 266. The filters 252, 254, 256, 258 include at least a current limiting device 268 such as resistor (268). An example of suitable filter includes a series resistor (268) with two shunt capacitors 270, 272 arranged in a π network. The values of the filter components are selected to allow a transition between the capacitances that is sufficiently fast to compensate for the adverse change in circumstances while being sufficiently slow to avoid noise from abrupt change in frequency due to the change in capacitance across the oscillator. For example, a relatively fast change in capacitance will result in an undesired change in frequency of tuning signal while a slower change will allow the PLL to compensate without significant consequences. The VRCLD also includes a SCS 244 since the change in current supply is managed by the SCS to further establish the rate of change in voltage at the selectable capacitance device 118. Accordingly, in the exemplary embodiment, the VRCLD includes a portion of the capacitance controller 122. Other techniques may be used to limit the rate of change in voltage in some circumstances.

The output of the VRCLD 130 is applied to the two varactors 274, 276 forming the corresponding selectable capacitance device 118. The two varactors 274, 276 are connected and biased such that a ground potential at the control port 278 reverse biases both varactors 274, 276 to set the capacitance of each varactor relatively high. The reference ports 280, 282 are connected to the oscillator 102. As the voltage at the control port 278 is increased, the capacitance of both varactors decreases. Accordingly, when the control signal voltage 134 is at ground potential and all charge has been discharged, the varactors 274, 276 are reversed biased resulting in the first component capacitance. When the control signal voltage 134 is a logic high value, the varactors 274, 276 are forward biased to establish the second component capacitance which is lower than the first component capacitance.

Each of the selectable capacitance devices includes two varactors in the example. Accordingly, the second selectable capacitance device 119 includes two varactors 284, 286, the N−1 selectable capacitance device 264 includes two varactors 288, 290, and the N selectable capacitance device 266 includes two varactors 292, 294. The varactors 274, 276, 284, 286, 288, 290, 292, 294 form a varactor bank 296. Any combination of varactors sizes and values may be used. An example of a suitable arrangement includes using varactor pairs having the same size, capacitance and performance characteristic. In circumstances where the varactors are different, the capacitance controller may need to be aware of correspondence between control signal and the different values.

In the exemplary embodiment, therefore, the digital control circuit 228 generates a signal bus 230 that includes a plurality of digital signals 232, 234, 236, 238. The digital signals control switchable current sources 244, 246, 248, 250 to produce control signals 120, 126, 240, 242. The switchable current sources 244, 246, 248, 250 and the filters 252, 254, 256, 258 form VRCLDs that limit the rate of change in voltage at the control inputs of the selectable capacitance devices 118, 119, 264, 266. The VRCLDs, therefore, limit the rate of change of the capacitance of the selectable capacitance devices 118, 119, 264, 266 and the selective capacitance arrangement 124.

Figure 3:
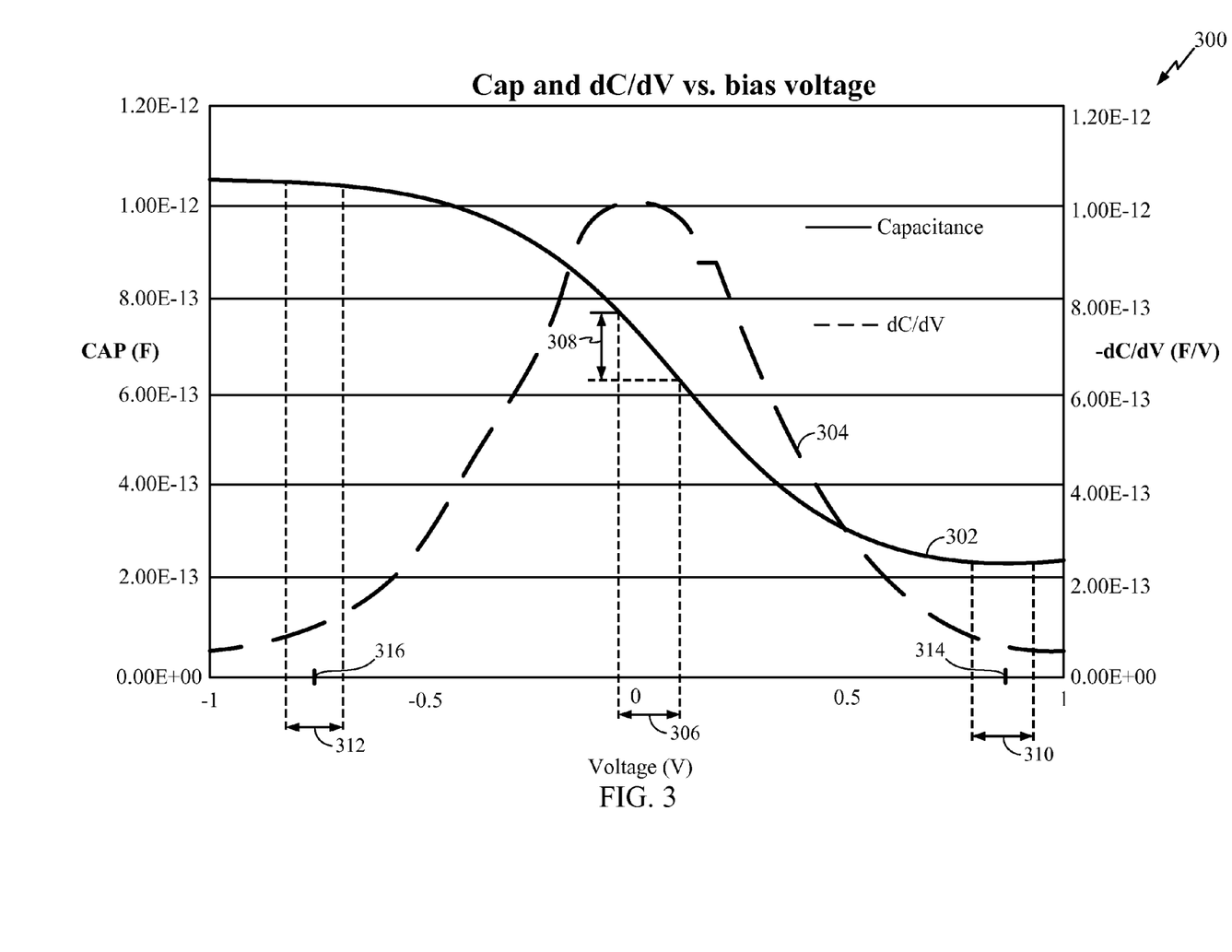
FIG. 3 is graphical representation of an example of capacitance characteristics of a varactor.

FIG. 3 is graphical representation 300 of an example of capacitance characteristics of a varactor. In FIG. 3, a voltage to capacitance relationship 302 of the varactor is represented by a sold line and the change in voltage to the change in capacitance relationship 304 is represented by a dashed line. The voltage in the illustration is the bias applied to the control port 278 relative to the bias reference voltage at the reference port 280. As can be seen from the graphical illustration, voltage changes near a bias voltage of zero result in greater changes in capacitance than voltage changes near one volt. Accordingly, the sensitivity of the varactor is lower at voltages away from zero. For example, a voltage change within a first voltage region 306 can result in capacitance change 308 that is significantly greater than capacitance changes resulting from voltage changes in second voltage range 310 and third voltage range 312. As shown in FIG. 3, the capacitance remains constant for voltage changes within each of the second voltage range 310 and third voltage range 312.

In the exemplary embodiment, the control signal voltage applied to the control port of each varactor is within either the second voltage range 310 or the third voltage range 312, depending on the relative polarity of the varactor within the circuit and the value of the control signal. Since the pair of varactors are oppositely connected to each other, application of one of the control signal voltage value 314 will result in a positive bias voltage across both varactors of the selectable capacitance device. The application of the other control signal voltage value 316 results in a negative bias across both varactors. Accordingly, if the illustration of FIG. 3 applies to single varactor, doubling the capacitance values of FIG. 3 results in a suitable representation of the characteristics of a selectable capacitance device including a varactor pair. In some circumstances, a single varactor can be used without the differential reference.

Therefore, by selecting control signals with voltages within the regions with less sensitivity, the capacitance of the varactor is less susceptible to errors in control voltage and noise. Noise coupled to the control port is less likely to result in noise within the PLL when the varactor control voltages are not near zero.

Figure 4:
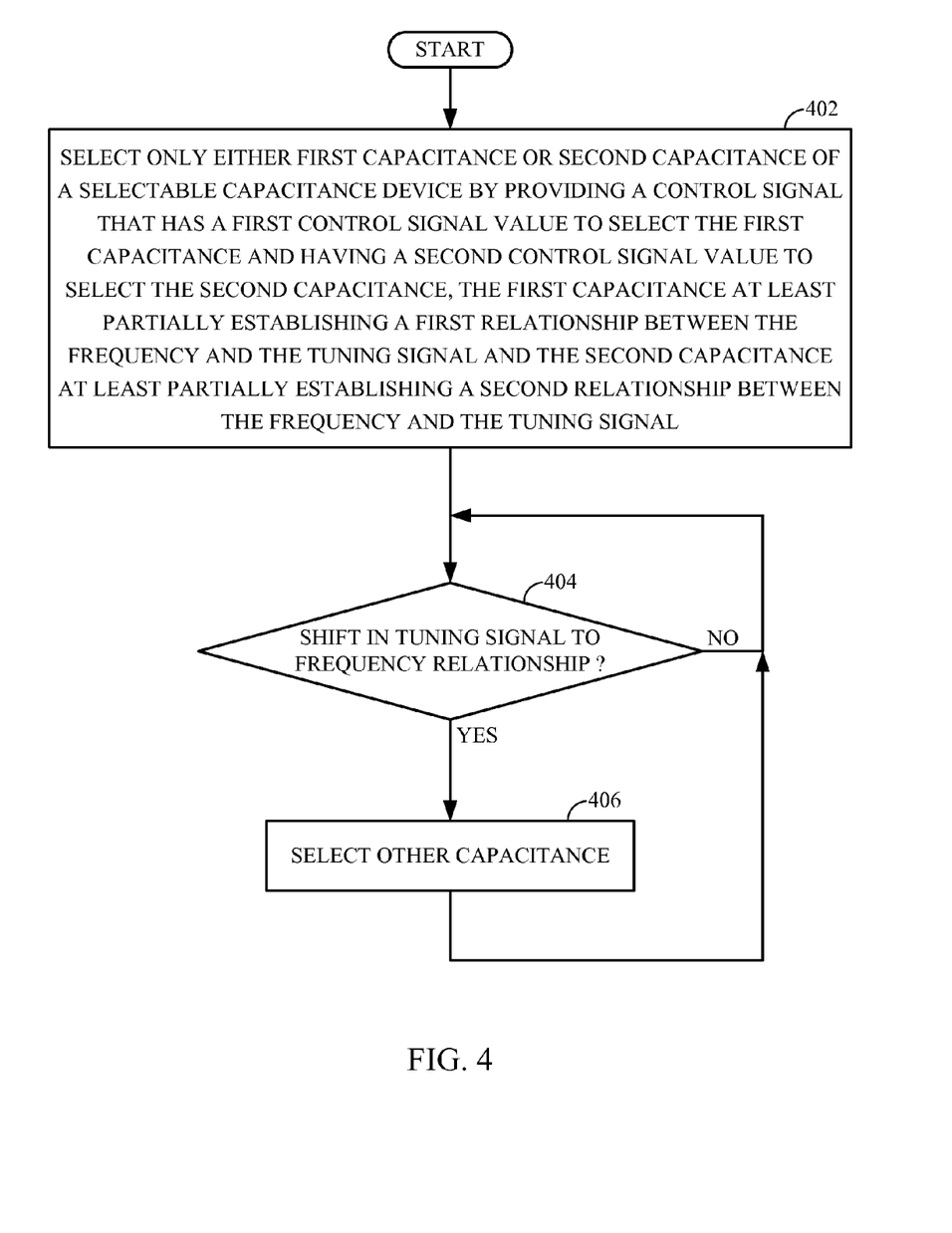
FIG. 4 is a flow chart of a method of managing a phased locked loop (PLL) apparatus.

FIG. 4 is a flow chart of a method of managing a phased locked loop (PLL) apparatus. The steps discussed with reference to FIG. 4, FIG. 5 and FIG. 6 may be performed by any combination devices circuitry and/or code. Further, the order of the steps may be changed in some circumstances and two or more steps can be performed simultaneously. In the exemplary embodiment, the method is performed by the PLL apparatus 100.

At step 402, either a first capacitance or a second capacitance of the selectable capacitance device is selected. The capacitance that is selected can be only the first capacitance or the second capacitance. The capacitance controller 122, therefore selects only either the first capacitance or the second capacitance of the selectable capacitance device by providing a control signal that has the control signal first value to select the first capacitance or having a control signal second value to select the second capacitance. The first capacitance at least partially establishes a first relationship between the frequency and the tuning signal and the second capacitance at least partially establishes a second relationship between the frequency and the tuning signal.

At step 404, it is determined whether a shift in the relationship between the tuning signal and the frequency of the oscillator signal has occurred. If a shift has occurred, the method continues at step 406. Otherwise, the method returns to step 404 to continue monitoring the relationship. The capacitance controller 122 determines if the tuning signal voltages provided at the input to the variable capacitance device 104 result in the desired frequencies of the oscillator output signal. The determination is made by evaluating the tuning signal. One example discussed with reference to FIG. 5 includes comparing the tuning signal to at least one voltage threshold.

At step 406, the other capacitance is selected. The capacitance controller 122 generates a control signal having the other control signal value. For example, if the first capacitance was selected at step 402, the capacitance controller 122 generates the control signal to have the control signal second value at step 406. After the capacitance is changed, the method returns to step 404 to continue monitoring the relationship.

Therefore, the capacitance controller 122 detects a shift in the relationship between the tuning signal and the frequency and compensates for the shift by changing the capacitance of the selectable capacitance device.

Figure 5:
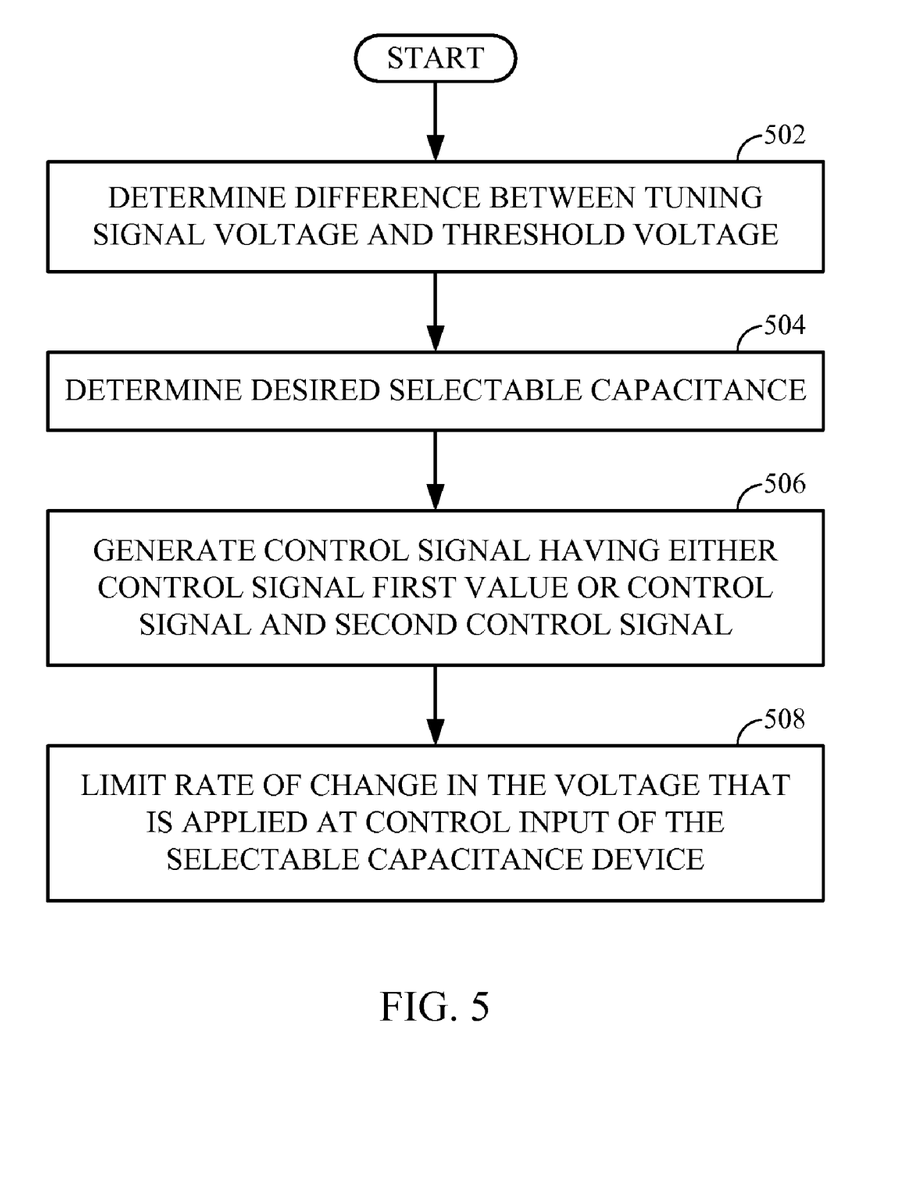
FIG. 5 is a flow chart of a method of managing a PLL apparatus where the tuning signal voltage is evaluated.

FIG. 5 is a flow chart of a method of managing a PLL apparatus where the tuning signal voltage is evaluated. The method of FIG. 5 is an example of suitable method of performing steps 404 and 406 of the method described with reference to FIG. 4 above.

At step 502, a difference between the tuning signal voltage and a threshold voltage is determined. In the exemplary embodiment, the tuning signal voltage is compared to a minimum voltage and a maximum voltage defining boundaries of a desired tuning signal input range. The desired tuning signal input range includes the range of tuning signal voltages that result in the desired frequency range of the voltage controlled oscillator 102. As described above, comparators generate signals based on the difference between the tuning signal voltage and the minimum and maximum voltages.

At step 504, a desired selectable capacitance is determined. The desired selectable capacitance is the capacitance of the selectable capacitance device. The comparator signals are evaluated to determine the desired capacitance to maintain the desired tuning signal voltage range. The determination may be relative determination or a value. For example, the determination may include the identification that the capacitance should be increased or decreased by an increment. Such an implementation results in a feedback loop that increases or decreases capacitance of the selectable capacitance device 118 without evaluating the value of the capacitance. Where the determination is of the capacitance results in value, an appropriate capacitance may be associated to the values of the comparator signals, for example. Since the determined capacitance is used to generate the control signal in step 506, such an arrangement may include a stored lookup table for associating comparator signals to control signals. Accordingly, in some situations, step 504 may be omitted and the comparator signals may be used to directly generate the control signals.

At step 506, the control signal is generated to set the selectable capacitance device to the desired capacitance where the desired capacitance is either the first capacitance or the second capacitance. The capacitance controller 122 generates the control signal to have either the control signal first value or the control signal second value. The value of the control signal is selected to at least partially shift the tuning signal input voltage range in a direction opposite to any undesired shift. Where no shift has been detected, the control signals maintain their current values. As described above, the digital control circuit 228 generates digital signals that are applied to switchable current sources. The resulting control signals are further processed at step 508.

At step 508, the rate of change in voltage that is applied to the control input of the selectable capacitance device is limited. In the exemplary embodiment, the control signals are filtered by the charge limiting devices to limit the rate that the voltages at the selectable capacitance device changes. The control voltage, therefore, is switched between two voltages at a rate that is fast enough to compensate for the undesired shift in tuning signal to frequency relationship but slow enough to minimize noise due to abrupt changes in the PLL due to the capacitance changes.

Figure 6:
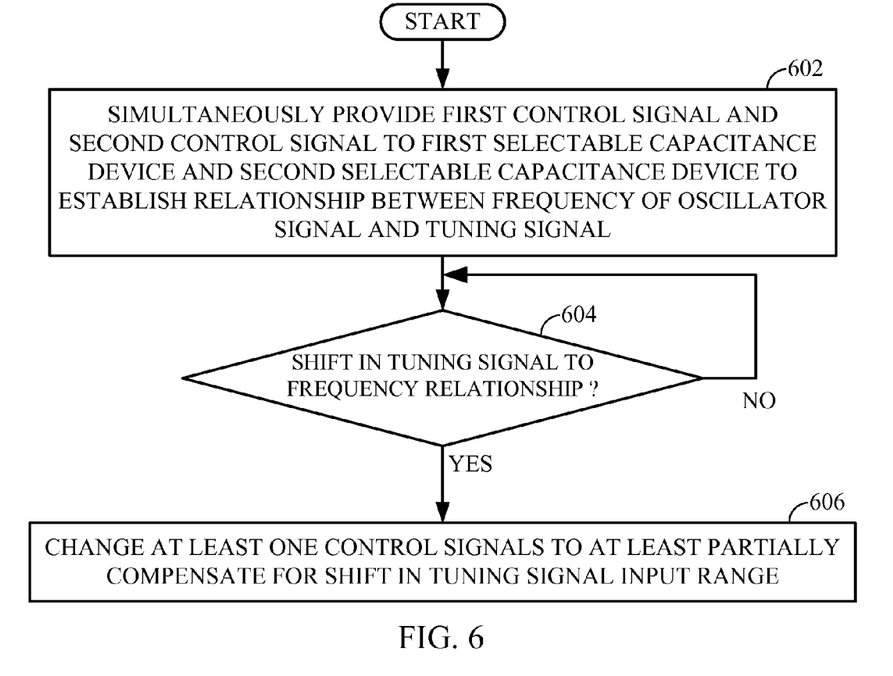
FIG. 6 is flow chart a method of managing a phased locked loop (PLL) apparatus including a plurality of selectable capacitance devices.

FIG. 6 is a flow chart of a method of managing a PLL apparatus where the selectable capacitance device is part of a selective capacitance arrangement including a plurality of selectable capacitance devices.

At step 602, a first control signal and a second control signal are simultaneously provided to a first selectable capacitance device and a second selectable capacitance device, respectively. The control signals set the capacitance of the selective capacitance arrangement 124 to establish the relationship between the frequency of oscillator output signal 106 and the tuning signal 112. The parallel combination of selectable capacitance devices provides a capacitance across the oscillator 102 to at least partially determine the frequency of the oscillator output signal 106 for a given tuning signal voltage.

At step 604, it is determined whether there has been a shift in the tuning signal input range. The capacitance controller 122 determines if the tuning signal voltages provided at the input to the variable capacitance device 104 result in the desired frequencies of the oscillator output signal. The determination is made by evaluating the tuning signal. One example discussed with reference to FIG. 7 includes comparing the tuning signal to at least one voltage threshold. If a shift in tuning range is detected, the method continues at step 606. Otherwise, the method continues to monitor the tuning signal input range at step 604.

At step 606, at least one of the control signals is changed to at least partially compensate for the shift in relationship between the tuning signal and frequency. The capacitance controller 122 determines the capacitance that will shift the tuning signal input range in a direction opposite to the undesired shift detected at step 604. The control signals are generated and provided to the selective capacitance arrangement 124 to change the capacitance of at least one of the selectable capacitance devices. The change in capacitance shifts the tuning signal to frequency relationship.

Figure 7:
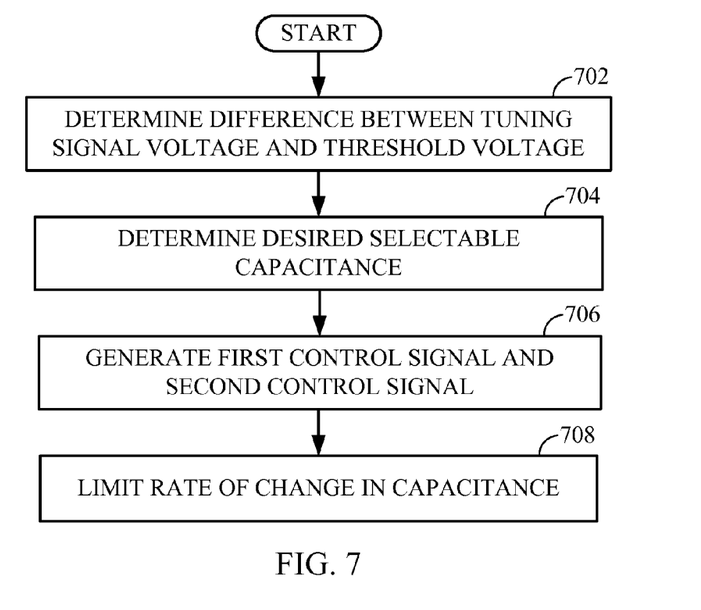
FIG. 7 is a flow chart of a method of managing a PLL apparatus including a plurality of selectable capacitance devices where the tuning signal voltage is evaluated.

FIG. 7 is a flow chart of a method of managing a PLL apparatus where the tuning signal voltage is evaluated. The method of FIG. 7 is an example of a suitable method of performing steps 604 and 606 of the method described with reference to FIG. 6 above.

At step 702, a difference between the tuning signal voltage and a threshold voltage is determined. In the exemplary embodiment, the tuning signal voltage is compared to a minimum voltage and a maximum voltage defining boundaries of a desired tuning signal input range. The desired tuning signal input range includes the range of tuning signal voltages that result in the desired frequency range of the voltage controlled oscillator. As described above, comparators generate signals based on the difference between the tuning signal voltage and the minimum and maximum voltages.

At step 704, a desired selectable capacitance is determined. The desired selectable capacitance is the capacitance of the selective capacitance arrangement 124. The comparator signals are evaluated to determine the desired capacitance to maintain the desired tuning signal voltage range by maintaining the desired tuning signal to frequency relationship. The determination may be a relative determination or a value. For example, the determination may include the identification that the capacitance should be increased or decreased by an increment. Such an implementation results in a feedback loop that increases or decreases capacitance of the selectable capacitance device 118 without evaluating the value of the capacitance. Where the determination is of the capacitance results in value, an appropriate capacitance may be associated to the values of the comparator signals, for example. Since the determined capacitance is used to generate the control signal in step 706, such an arrangement may include a stored lookup table for associating comparator signals to control signals. Accordingly, in some situations, step 704 may be omitted and the comparator signals may be used to directly generate the control signals.

At step 706, at least two control signals are generated. Accordingly, at least the first control signal and the second control signal are generated by the capacitance controller 122. The values of the control signals are selected to at least partially shift the tuning signal input voltage range in a direction opposite to any undesired shift. Therefore, the plurality of control signals are selected to set the capacitances of the plurality of selectable capacitance devices in the selective capacitance arrangement 124 to establish the desired tuning signal to frequency relationship. Where no shift has been detected, the control signals maintain their current values. Any number of the control signals may be changed from their previous value to new value when compensation is preferred. As described above, the digital control circuit 228 generates digital signals that are applied to switchable current sources. The resulting control signals are further processed at step 708.

At step 708, the rate of change in voltages that are applied to the control inputs of the selectable capacitance devices is limited. In the exemplary embodiment, the control signals are generated by the current source and are filtered by the filters. Therefore, the voltage rate of change limiting devices (VR-CLDs) are implemented using the charge current sources and filters to limit the rate that the voltages at the selectable capacitance devices change. The control voltages, therefore, are switched between two voltages at rates that are fast enough to compensate for the undesired shift in tuning signal to frequency relationship but slow enough to minimize noise due to abrupt changes in the PLL due to the capacitance changes.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A phase locked loop (PLL) apparatus comprising:
   an oscillator configured to generate an oscillator signal;
   a variable capacitance device connected to the oscillator and having a tuning capacitance responsive to a tuning signal to alter a frequency of the oscillator signal;
   a selectable capacitance arrangement, comprising a plurality of selectable capacitance devices, connected to the oscillator and responsive to a plurality of corresponding control signals such that each selectable capacitance device has a first capacitance at a corresponding control signal first value and a second capacitance at a corresponding control signal second value;

a capacitance controller configured to determine, using a lookup table, a desired capacitance to maintain a tuning signal voltage range, and select either the first capacitance or the second capacitance of at least one of the selectable capacitance devices by providing the corresponding control signal that has the control signal first value to select the first capacitance and having the control signal second value to select the second capacitance, such that the selectable capacitance arrangement provides the desired capacitance; and a voltage rate of change limiting device (VRCLD) configured to limit a rate of change in the voltage that is applied to a corresponding control input at each of the selectable capacitance devices, wherein the VRCLD comprises a charge pump and a filter.

2. The PLL apparatus of claim 1, wherein the capacitance controller is configured to compensate for a shift in a relationship between the tuning signal and the frequency by changing the corresponding control signal for at least one of the selectable capacitance devices from the control signal first value to the control signal second value.

3. The PLL apparatus of claim 2, wherein a shift in the relationship between the tuning signal and the frequency is due to at least one of a temperature change, a supply voltage change, a change in component age, a change in physical configuration of a circuit, a change in physical configuration of a housing, and a change in physical configuration of a device.

4. The PLL apparatus of claim 1, wherein each selectable capacitance device has a selectable capacitance device capacitance non-linearly related to a bias voltage and defined by a ratio to voltage function where a capacitance change to voltage change ratio ($\Delta C/\Delta V$) is a function of the bias voltage, the control signal first value and the control signal second value selected to establish bias voltages in regions of the ($\Delta C/\Delta V$) ratio to voltage function having lower ($\Delta C/\Delta V$) ratio to bias voltage ratios (($\Delta C/\Delta V$)/V) than at least one other region of the ($\Delta C/\Delta V$) ratio to voltage function.

5. The PLL apparatus of claim 4, wherein each selectable capacitance device capacitance is constant for the bias voltages in the regions.

6. The PLL apparatus of claim 1, wherein each selectable capacitance device includes at least two variable capacitance elements.

7. The PLL apparatus of claim 1, further comprising a voltage rate of change limiting device (VRCLD) configured to limit a rate of change in the voltage that is applied to a corresponding control input at each of the selectable capacitance devices.

8. The PLL apparatus of claim 1, wherein the selectable capacitance arrangement comprises a first selectable capacitance device having a first component capacitance responsive to a first control signal, and a second selectable capacitance device having a second component capacitance responsive to a second control signal, wherein the capacitance controller is further configured to simultaneously provide the first control signal and the second control signal, the first control signal setting the first component capacitance to either the first capacitance or the second capacitance and the second control signal setting the second component capacitance to either a third capacitance or a fourth capacitance.

9. A phase locked loop (PLL) apparatus comprising:
an oscillator configured to generate an oscillator signal;
a variable capacitance device connected to the oscillator and having a tuning capacitance responsive to a tuning signal to alter a frequency of the oscillator signal;

a selectable capacitance arrangement, comprising a plurality of selectable capacitance devices, connected to the oscillator and responsive to a plurality of corresponding control signals such that each selectable capacitance device has a first capacitance at a corresponding control signal first value and a second capacitance at a corresponding control signal second value;

a capacitance controller configured to determine, using a lookup table, a desired capacitance to maintain a tuning signal voltage range, and select either the first capacitance or the second capacitance of at least one of the selectable capacitance devices by providing the corresponding control signal that has the control signal first value to select the first capacitance and having the control signal second value to select the second capacitance, such that the selectable capacitance arrangement provides the desired capacitance; and a voltage rate of change limiting device (VRCLD) configured to limit a rate of change in the voltage that is applied to a corresponding control input at each of the selectable capacitance devices, wherein the VRCLD comprises a current limiting element limiting a current between the capacitance controller and the selectable capacitance arrangement, and wherein the VRCLD comprises a filter or a switchable current source.

10. A method of shifting a tuning range of a phase locked loop apparatus comprising an oscillator generating an oscillator signal having a frequency based on a tuning signal, the method comprising:

determining, using a lookup table, a desired capacitance to maintain a tuning signal voltage;

selecting either a first capacitance or a second capacitance of at least one selectable capacitance device, of a plurality of selectable capacitance devices, by providing a control signal that has a control signal first value to select the first capacitance and having a control signal second value to select the second capacitance, the first capacitance at least partially establishing a first relationship between the frequency and the tuning signal and the second capacitance at least partially establishing a second relationship between the frequency and the tuning signal, such that the plurality of selectable capacitance devices provides the desired capacitance; and limiting a rate of change in a voltage that is applied at a control input at each selectable capacitance device, wherein limiting the rate of change in the voltage comprises filtering of the control signal.

11. The method of claim 10, further comprising:
determining a difference between a tuning signal voltage and a threshold voltage;
determining the desired capacitance based on the difference;
generating the control signal in accordance with the desired capacitance to set the at least one selectable capacitance device to either the first capacitance or the second capacitance.

12. The method of claim 11, wherein determining the desired capacitance comprises selecting the desired capacitance to increase the difference between the threshold voltage and the tuning signal voltage for a particular frequency of the oscillator signal.

13. The method of claim 12, wherein determining the difference comprises comparing the tuning signal voltage to a minimum voltage and to a maximum voltage; and wherein the desired capacitance maintains an oscillator output signal frequency range corresponding to a tuning signal input range between the minimum voltage and maximum voltage.

14. The method of claim 10, further comprising:
   detecting a shift in a relationship between the tuning signal and the frequency;
   changing the control signal from the control signal first value to the control signal second value to at least partially compensate for the shift in an opposite direction to direction of the shift.

15. The method of claim 14, wherein the shift in the relationship between the tuning signal and the frequency is due to at least one of a temperature change, a supply voltage change, a change in component age, a change in physical configuration of a circuit, a change in physical configuration of a housing, and a change in physical configuration of a device.

16. The method of claim 10, wherein each selectable capacitance device includes at least two variable capacitance elements.

17. The method of claim 10, wherein limiting the rate of change in the voltage comprises managing a current of the control signal.

18. A method of claim 10, further comprising:
   simultaneously providing a first control signal to a first selectable capacitance device connected in parallel with the oscillator generating the oscillator signal and a second control signal to a second selectable capacitance device connected in parallel with the oscillator to set a selectable capacitance at least partially establishing a relationship between the frequency and the tuning signal.

19. A phase locked loop (PLL) apparatus comprising:
   an oscillator means for generating an oscillator signal;
   a variable capacitance device means for altering a frequency of the oscillator signal, the variable capacitance device means connected to the oscillator means and having a tuning capacitance responsive to a tuning signal to alter the frequency of the oscillator signal;
   a selectable capacitance arrangement means, comprising a plurality of selectable capacitance device means for selecting a selectable capacitance, the plurality of selectable capacitance device means connected to the oscillator means and responsive to a plurality of corresponding control signals such that each selectable capacitance device means has a first capacitance at a corresponding control signal first value and a second capacitance at a corresponding control signal second value; and
   a capacitance controller means for determining, using a lookup table, a desired capacitance to maintain a tuning signal voltage range, and controlling the selectable capacitance by selecting either the first capacitance or the second capacitance of at least one of the plurality of selectable capacitance device means by providing the corresponding control signal that has the control signal first value to select the first capacitance and having the control signal second value to select the second capacitance, such that the selectable capacitance arrangement means provides the desired capacitance; and
   a voltage rate of change limiting device (VRCLD) means for limiting a rate of change in the voltage that is applied to a corresponding control input at each of the selectable capacitance device means,
   wherein the VRCLD means comprises a filter means or a charge pump means.

20. The PLL apparatus of claim 19, wherein the capacitance controller means is further for compensating for a shift in a relationship between the tuning signal and the frequency by changing the control signal from the control signal first value to the control signal second value.

21. The PLL apparatus of claim 20, wherein the shift in the relationship between the tuning signal and the frequency is due to at least one of a temperature change, a supply voltage change, a change in component age, a change in physical configuration of a circuit, a change in physical configuration of a housing, and a change in physical configuration of a device.

22. The PLL apparatus of claim 19, wherein each selectable capacitance device means has a selectable capacitance device capacitance non-linearly related to a bias voltage and defined by a ratio to voltage function where a capacitance change to voltage change ratio ($\Delta C/\Delta V$) is a function of the bias voltage, the control signal first value and the control signal second value selected to establish bias voltages in regions of the ($\Delta C/\Delta V$) ratio to voltage function having lower ($\Delta C/\Delta V$) ratio to bias voltage ratios (($\Delta C/\Delta V$)/V) than at least one other region of the ($\Delta C/\Delta V$) ratio to voltage function.

23. The PLL apparatus of claim 22, wherein each selectable capacitance device capacitance is constant for bias voltages in the regions.

24. The PLL apparatus of claim 19, wherein each selectable capacitance device means includes at least two variable capacitance element means.

25. The PLL apparatus of claim 19, wherein the VRCLD means comprises a current limiting element means for limiting a current between the capacitance controller means and the selectable capacitance arrangement means.

26. The PLL apparatus of claim 19, wherein the selectable capacitance arrangement means comprises a first selectable capacitance device means having a first component capacitance responsive to a first control signal, and a second selectable capacitance device means having a second component capacitance responsive to a second control signal and wherein the capacitance controller means is for simultaneously providing the first control signal and the second control signal, the first control signal setting the first component capacitance to either the first capacitance or the second capacitance and the second control signal setting the second component capacitance to either a third capacitance or a fourth capacitance.

27. A computer-readable medium encoded with computer-executable instructions, the execution of the computer-executable instructions for shifting a tuning range of a phase locked loop apparatus comprising an oscillator generating an oscillator signal having a frequency based on a tuning signal, the execution of the computer-executable instructions for:
   determining, using a lookup table, a desired capacitance to maintain a tuning signal voltage;
   selecting either a first capacitance or a second capacitance of at least one selectable capacitance device, of a plurality of selectable capacitance devices, by providing a control signal that has a control signal first value to select the first capacitance and having a control signal second value to select the second capacitance, the first capacitance at least partially establishing a first relationship between the frequency and the tuning signal and the second capacitance at least partially establishing a second relationship between the frequency and the tuning signal, such that the plurality of selectable capacitance devices provides the desired capacitance;
   determining a difference between the tuning signal voltage and a threshold voltage;
   determining the desired capacitance based on the difference; and generating the control signal in accordance with the desired capacitance to set the at least one selectable capacitance device to either the first capacitance or the second capacitance, wherein determining the desired capacitance comprises selecting the desired capacitance to increase the difference between the threshold voltage and the tuning signal voltage for a particular frequency of the oscillator signal, wherein determining the difference comprises comparing the tuning signal voltage to a minimum voltage and to a maximum voltage; and wherein the desired capacitance maintains an oscillator output signal frequency range corresponding to a tuning signal input range between the minimum voltage and maximum voltage.

28. The computer-readable medium of claim 27, further comprising computer-executable instructions for:

detecting a shift in a relationship between the tuning signal and the frequency;

changing the control signal from the control signal first value to the control signal second value to at least partially compensate for the shift in an opposite direction to direction of the shift.

29. The computer-readable medium of claim 28, wherein the shift in the relationship between the tuning signal and the frequency is due to at least one of a temperature change, a supply voltage change, a change in component age, a change in physical configuration of a circuit, a change in physical configuration of a housing, and a change in physical configuration of a device.

30. The computer-readable medium of claim 27, further comprising computer-executable instructions for:

limiting a rate of change in a voltage that is applied at a control input at each selectable capacitance device.

31. The computer-readable medium of claim 30, wherein limiting the rate of change in the voltage comprises managing a current of the control signal.

32. The computer-readable medium of claim 27, further comprising computer-executable instructions for:

simultaneously providing a first control signal to a first selectable capacitance device connected in parallel with the oscillator generating the oscillator signal and a second control signal to a second selectable capacitance device connected in parallel with the oscillator to set a selectable capacitance at least partially establishing a relationship between the frequency and the tuning signal.

* * * * *